United States Patent
Chou et al.

(10) Patent No.: US 10,930,496 B2
(45) Date of Patent: Feb. 23, 2021

(54) METHOD FOR FABRICATING HETEROEPITAXIAL SEMICONDUCTOR MATERIAL ON A MICA SHEET

(71) Applicant: NATIONAL CHIAO TUNG UNIVERSITY, Hsinchu (TW)

(72) Inventors: Yi-Chia Chou, Hsinchu (TW); Wan-Jung Lo, Hsinchu County (TW); Ying-Hao Chu, Hsinchu County (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 16/386,779

(22) Filed: Apr. 17, 2019

(65) Prior Publication Data

US 2020/0234944 A1    Jul. 23, 2020

(30) Foreign Application Priority Data

Jan. 18, 2019    (TW) ................ 10810208.5

(51) Int. Cl.
    *H01L 21/02*      (2006.01)
    *H01L 33/00*      (2010.01)

(52) U.S. Cl.
    CPC ...... *H01L 21/0242* (2013.01); *H01L 21/0254* (2013.01); *H01L 21/0262* (2013.01); *H01L 21/02546* (2013.01); *H01L 33/007* (2013.01)

(58) Field of Classification Search
    CPC ............. H01L 21/0242; H01L 21/0254; H01L 21/02546; H01L 21/0262
    See application file for complete search history.

(56) References Cited

U.S. PATENT DOCUMENTS

| | | | | |
|---|---|---|---|---|
| 2009/0278233 A1* | 11/2009 | Pinnington | ....... | H01L 21/02389 257/615 |
| 2016/0111497 A1* | 4/2016 | Simin | ................ | H01L 29/7786 257/365 |
| 2016/0192480 A1* | 6/2016 | Choi | .............. | H01L 31/022466 428/337 |
| 2017/0263808 A1* | 9/2017 | Hyun | ................ | H01L 33/0062 |

FOREIGN PATENT DOCUMENTS

| | | |
|---|---|---|
| CN | 204102913 U | 1/2015 |
| CN | 107557757 A | 1/2018 |

(Continued)

OTHER PUBLICATIONS

Matsuki, Heteroepitaxial growth of gallium nitride on muscovite mica plates by pulsed laser deposition, Aug. 24, 2005 (Year: 2005).*

(Continued)

*Primary Examiner* — Mohammad M Choudhry
(74) *Attorney, Agent, or Firm* — Rosenberg, Klein & Lee

(57) ABSTRACT

A method for fabricating heteroepitaxial semiconductor material on a mica sheet is disclosed. Firstly, a mica substrate is provided. Then, at least one semiconductor film is deposited on the mica substrate to form a flexible substrate whose flexibility is applied to various applications, such as wearable devices, portable photoelectric equipment, or improving the speed and bandwidth of commercial and military systems, such that the flexible substrate has the competitiveness in the market.

17 Claims, 12 Drawing Sheets

(56) References Cited

FOREIGN PATENT DOCUMENTS

| TW | 201718243 A | 6/2017 |
|---|---|---|
| TW | 201829200 A | 8/2018 |

OTHER PUBLICATIONS

Nobuyuki Matsuki, Tae-Won Kim, Jitsuo Ohta, Hiroshi Fujioka; Heteroepitaxial Growth of Gallium Nitride on Muscovite Mica Plates by Pulsed Laser Deposition, Solid State Communications, 136 *2005( 338-341).

Jung-Hun Seo, Jing Li, Jaeseong Lee, Shaoqin Gong, Jingyu Lin, Hongxing Jiang, Zhenqiang Ma, A Simplified Method of Making Flexible Blue LEDs on a Plastic Substrate; IEEE Photonics Journal, IEEE, vol. 7, No. 2, Apr. 2015, DOI: 10.1109/JPHOT.2015. 2412459, 1943-0655 2015 IEEE.

Hojun Lee, A Thick GaN Growth Using GaN/Si(111) Template by Hydride Vapor Phase Epitaxy (HVPE)—Art. No. 689406, Proceedings of SPIE, International Society for Optical Engineering, Mar. 2008.

S.W. Bedell, P. Lauro, J.A. Ott, K. Fogel, and D.K. Sadana, Layer Transfer of Bulk Gallium Nitride by Controlled Spalling, Citation: Journal of Applied Physics 122, 025103 (2017); DOI: 10.1063/1. 4986646.

Jeehwan Kim, Can Bayram, Hongsik Park, Cheng-Wei Cheng, Christos Dimitrakopoulos, John A. Ott, Kathleen B. Reuter, Stephen W. Bedell, Devendra K. Sanada, Principle of Direct van der Waals Epitaxy of Single-Crystalline Films on Epitaxial Graphene, Nature Communications, Sep. 11, 2014, DOI: 10.1038/ncomms5836, pp. 1-7.

Taha Ayari, Chris Bishop, Matthew B. Jordan, Suresh Sundaram, Xin Li, Saiful Alam, Youssef Elgmili, Gilles Patriarche, Paul L. Voss, Jean Paul Salvestrini, Abdallah Ougazzaden; Gas Sensors Boosted by Two-Dimensional h-BN Enabled Transfer on Thin Substrate Foils: Towards Wearable and Portable Applications, Scientific Reports, pp. 1-8, Nov. 9, 2017, 7:1512, DOI:10.1038/s41598-017-15065-6.

Nicholas R. Glavin, Kelson D. Chabak, Eric R. Heller, Elizabeth A. Moore, Timothy A. Prusnick, Benji Maruyama, Dennis E. Walker, Jr., Donald L. Dorsey, Qing Paduano, and Michael Snure; Flexible Gallium Nitride for High-Performance, Strainable Radio-Frequency Devices; Advanced Materials, 2017, 1701838, pp. 1-7, DOI: 10.1002/adma.201701838.

Akiyoshi Yamada, Kok Pin Ho, Takayuki Akaogi, Takahiro Maruyama, Katsuhiro Akimoto, Layered Compound Substrates for GaN Growth, Journal of Crystal Growth 201/202 (1999) 332-335.

\* cited by examiner

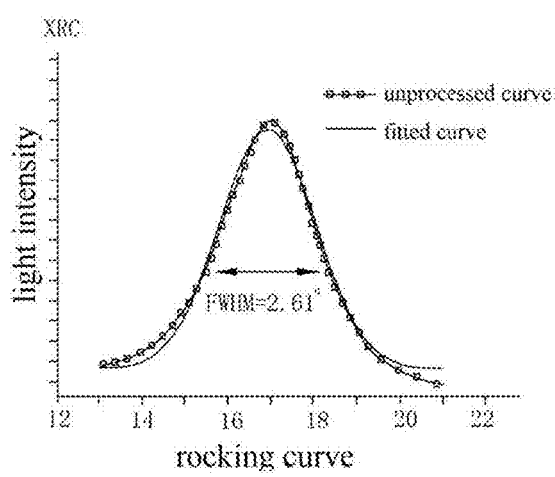
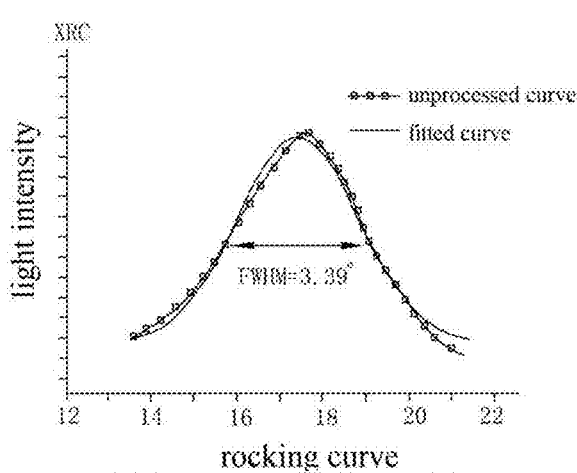
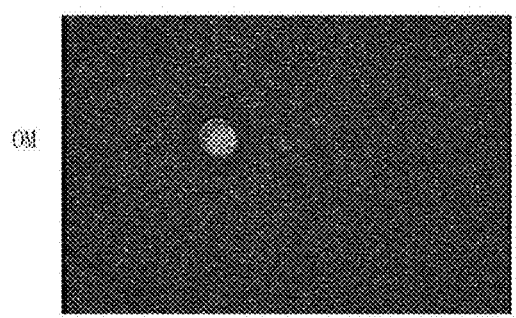
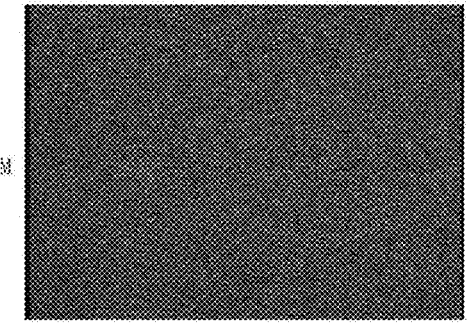
Fig. 5(a)　　　　Fig. 5(b)

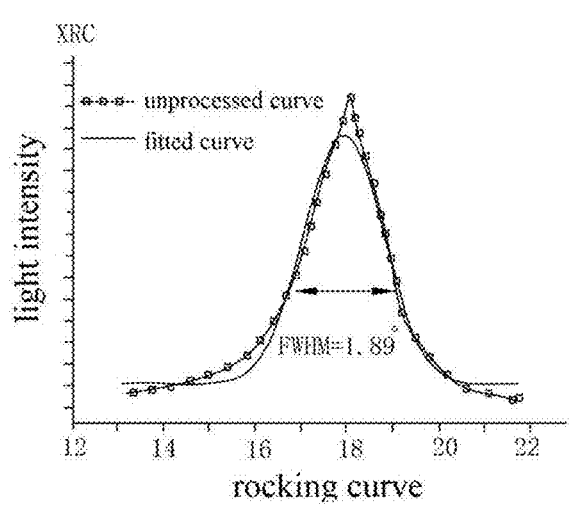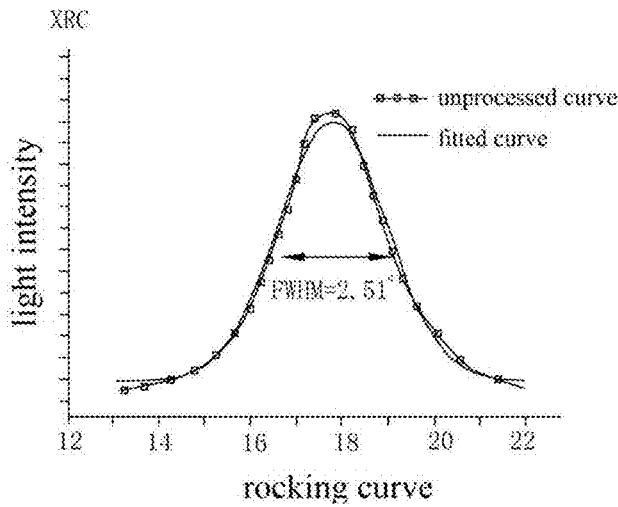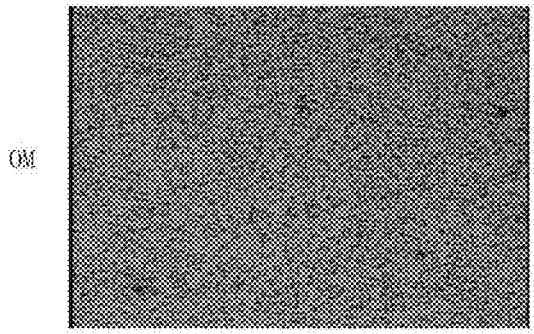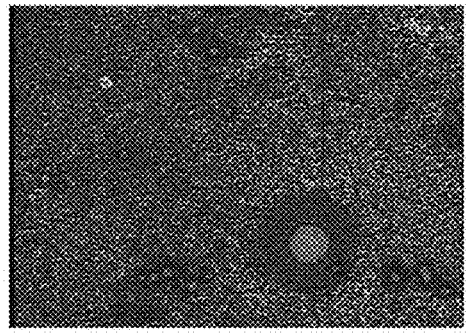
Fig. 5(c)          Fig. 5(d)

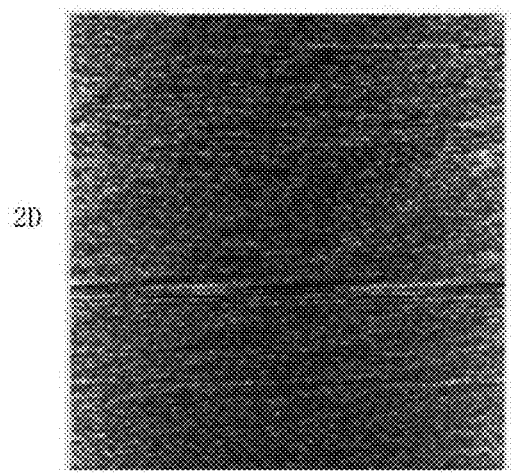
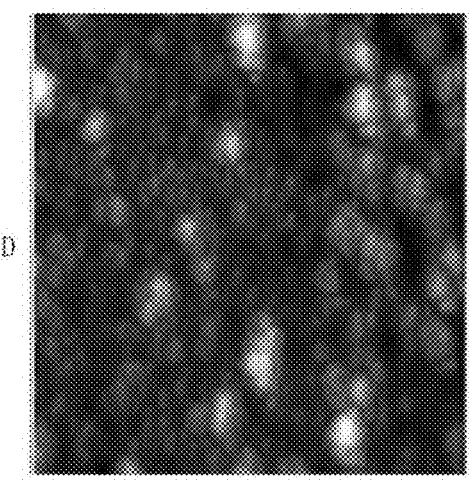
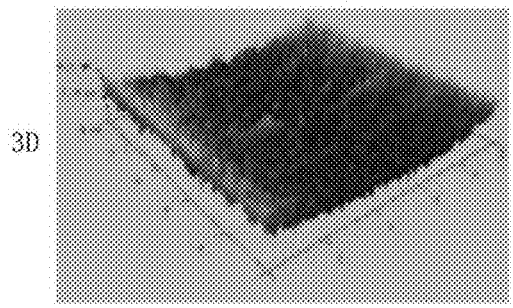
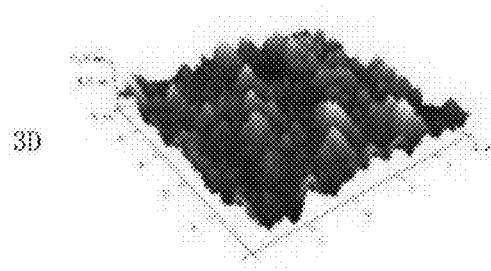
Fig. 6(a)    Fig. 6(b)

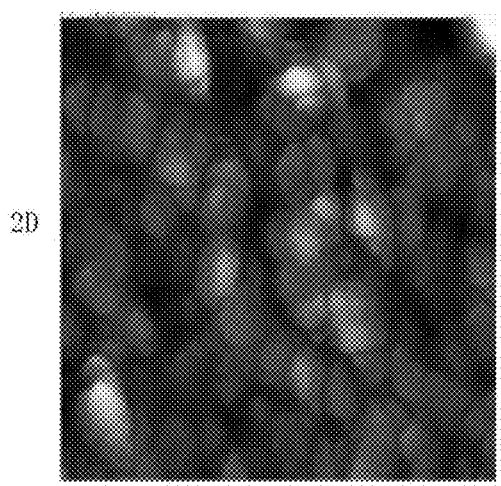
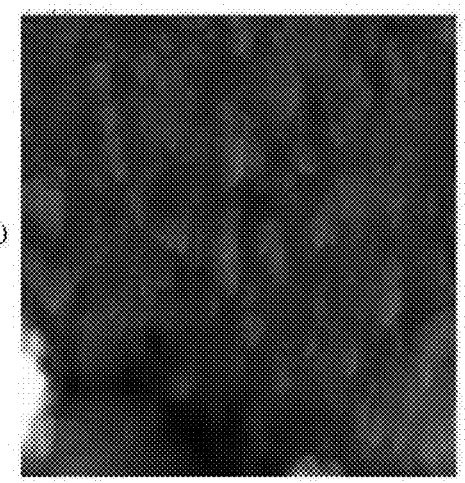
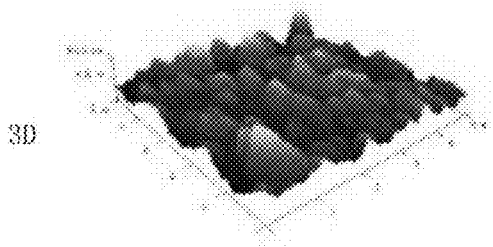
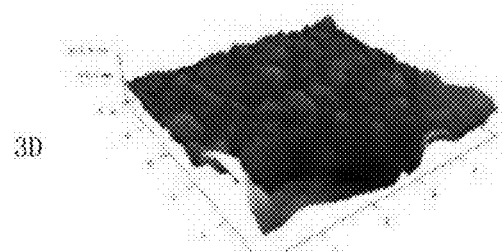
Fig. 6(c)				Fig. 6(d)

METHOD FOR FABRICATING HETEROEPITAXIAL SEMICONDUCTOR MATERIAL ON A MICA SHEET

This application claims priority for Taiwan patent application no. 108102085 filed on Jan. 18, 2019, the content of which is incorporated by reference in its entirely.

BACKGROUND OF THE INVENTION

Field of the Invention

The present invention relates to a method for fabricating heteroepitaxial semiconductor material on a mica sheet, which uses a van der Waals force-based heteroepitaxial mechanism to fabricate a flexible mica substrate having a semiconductor film under a specific fabrication condition.

Description of the Related Art

Among III-group nitrides, GaN is applied most widely. The success of nitride semiconductors is attributed to the growth LED industry. GaN is a direct-gap material. At room temperature, the bandgap of the GaN is 3.4 eV. GaN emits light having a wavelength of 365 nm within a range of ultraviolet light. GaN is widely applied to light emitting elements or light absorbing elements, such as laser elements, photo detectors, and light emitting diodes. In fabrication of devices, a substrate is mainly made of GaN. The epitaxy technology mostly focuses on a structural mismatch of lattices and a match for optical and electrical properties. For the maturity and market-applied potential of the substrate technology, GaN and AlN have better developing potential, especially GaN. GaN is a wide-bandgap material with a high saturated electron speed, a high breakdown voltage, and a high dissipation coefficient. As a result, GaN is used to fabricate devices with high-power, high-frequency, and heat-resistant properties. The total power consumption of the devices greatly decreases since the power consumption of turning on and switching the devices decreases. However, GaN is limited by its physical properties. For example, the pressure of dissolving GaN is larger than $10^5$ bar at the melting point. Thus, GaN is different from silicon that can directly grow substrates with mass production, large size, and high thickness in a liquid-phase crystal pulling method. Accordingly, GaN does not become the mainstream for mass production of semiconductors taking consideration of the cost. Also, the epitaxy technology has many drawbacks that need to be overcome.

By doping other elements and adjusting the percentages of composition, the application of nitrides emits light having a wavelength ranging from the wavelength of visible light to the wavelengths of ultraviolet light and infrared light. Thus, nitrides are widely applied to light emitting elements. Although GaAs and GaIn are also used, GaN has been one of the most important wide-bandgap semiconductors nowadays. Presently, GaN is epitaxially grown on a substrate made of aluminium oxide. However, the cost of aluminium oxide is much higher than that of silicon. It is difficult for aluminium oxide to integrate with the silicon semiconductor industry. The market development of aluminium oxide is slow. On the other side, a silicon substrate growing a GaN film features low cost, large area, and high heat conductivity. The silicon substrate is integrated with the mature silicon semiconductor industry. Nevertheless, silicon and GaN have a lattice mismatch of 16.1%. The thermal expansion coefficient of silicon is different from that of GaN by 54%. If a GaN film is directly formed on a silicon substrate, the GaN film will generate defects with high density or cracks and the heteroepitaxial technology will have a bottleneck. With the growing popularity of exercise habit of people, the demand for flexible electronic components has increased year by year. However, limited by fabrication temperature and physical and chemical properties, a GaN film, a GaAs film, or a GaIn film is not grown on the silicon substrate through a sapphire substrate or a SiC substrate to achieve flexibility. As a result, how to use the semiconductor epitaxy technology to successfully fabricate flexible substrates used for wearable electronic devices is a problem to be overcome.

To overcome the abovementioned problems, the present invention provides a method for fabricating heteroepitaxial semiconductor material on a mica sheet, so as to solve the afore-mentioned problems of the prior art.

SUMMARY OF THE INVENTION

The primary objective of the present invention is to provide a method for fabricating heteroepitaxial semiconductor material on a mica sheet, which uses a van der Waals force-based epitaxy method to grow a GaN film on a mica substrate under a specific fabrication condition. The present invention not only reduces the stress between the film and the substrate, but also achieves the best quality of heterogeneous epitaxy. The present invention fabricates a flexible substrate that features large area, acid and alkaline resisting properties, high transparency, ultrahigh thermal stability, and long-preserved properties.

Another objective of the present invention is to provide a method for fabricating heteroepitaxial semiconductor material on a mica sheet, which epitaxially grows a semiconductor film on a mica substrate to fabricate a flexible substrate whose flexibility is applied to various applications, such as wearable devices, portable photoelectric equipment, or improving the speed and bandwidth of commercial and military systems, such that the flexible substrate has the competitiveness in the market.

To achieve the abovementioned objectives, the present invention provides a method for fabricating heteroepitaxial semiconductor material on a mica sheet. Firstly, a mica substrate is provided. Then, at least one semiconductor film is deposited on the mica substrate to form a flexible substrate.

In an embodiment of the present invention, the at least one semiconductor film is the GaN film, and in the step of depositing the at least one semiconductor film on the mica substrate, the GaN film is deposited on the mica substrate under a pressure of 700 torr at a temperature of 600~950° C.

In an embodiment of the present invention, the step of depositing the GaN film is performed in a chamber. In the step of depositing the GaN film on the mica substrate under the pressure of 700 torr at the temperature of 600~950° C. in the chamber, gas is inputted into the chamber, and the gas includes ammonia, hydrogen chloride and carrier gas. The carrier gas comprises hydrogen and nitrogen.

In an embodiment of the present invention, the number of the GaN films is two. In the step of depositing the two semiconductor films on the mica substrate, the two semiconductor films are deposited on the mica substrate at a temperature of 600~950° C. during two stages. The temperature of the first stage is 600° C., and the temperature of the second stage is 950° C. Before depositing the second GaN film, the two semiconductor films are annealed at a temperature of 750° C. for 10 minutes.

In an embodiment of the present invention, the semiconductor film is deposited on the mica substrate by hydride vapor phase epitaxy (HVPE), pulsed laser deposition (PLD), or molecular beam epitaxy (MBE). The thickness of the at least one semiconductor film is 1%~50% of the thickness of the mica substrate.

Below, the embodiments are described in detail in cooperation with the drawings to make easily understood the technical contents, characteristics and accomplishments of the present invention.

BRIEF DESCRIPTION OF THE DRAWINGS

FIGS. 5(a)-5(d) are diagrams showing the images of a GaN film observed by an optical microscope and X-ray rocking curves of the GaN film according to an embodiment of the present invention;

FIGS. 6(a)-6(d) are diagrams showing the two-dimensional and three-dimensional images of a flexible substrate observed by an atomic force microscope according to an embodiment of the present invention;

DETAILED DESCRIPTION OF THE INVENTION

In order to satisfy the requirement of wearable electronic devices and other flexible products, silicon substrates and sapphire substrates are used. However, limited by the fabrication temperature, physical and chemical properties, and the bottleneck of the epitaxy technology, a GaN film is not grown on the silicon substrate or the sapphire substrate to fabricate a flexible product. Thus, the present invention researches and improves the conventional technology for many years, so as to develop a method for fabricating heteroepitaxial semiconductor material on a mica sheet. The method uses a simple process to fabricate a flexible substrate with economic benefits, brings technical breakthroughs to the conventional fabrication process, and broadens horizons of the future technology.

Figure 1:
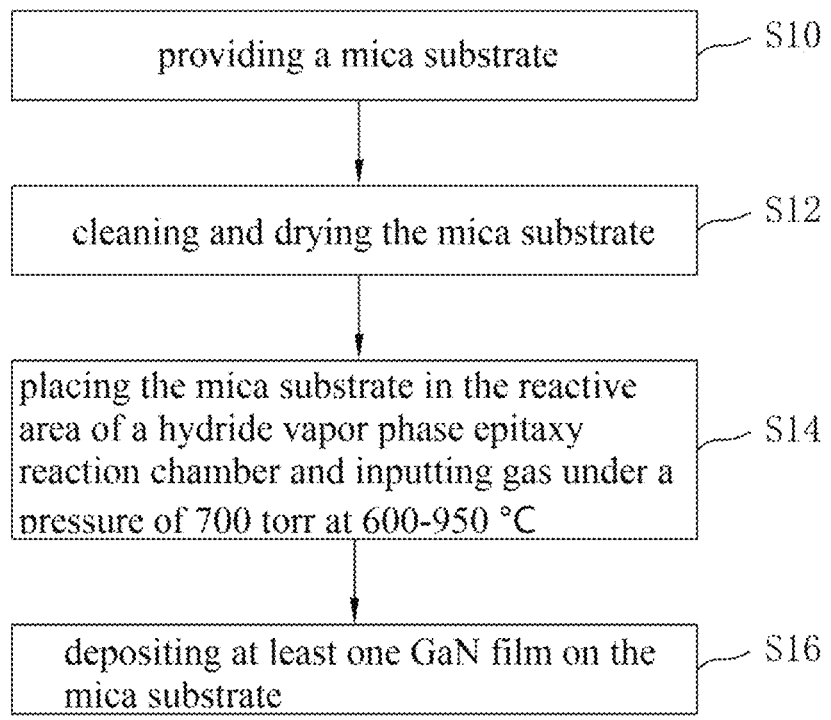
FIG. 1 is a flowchart of a method for fabricating heteroepitaxial semiconductor material on a mica sheet according to an embodiment of the present invention.
Figure 2:
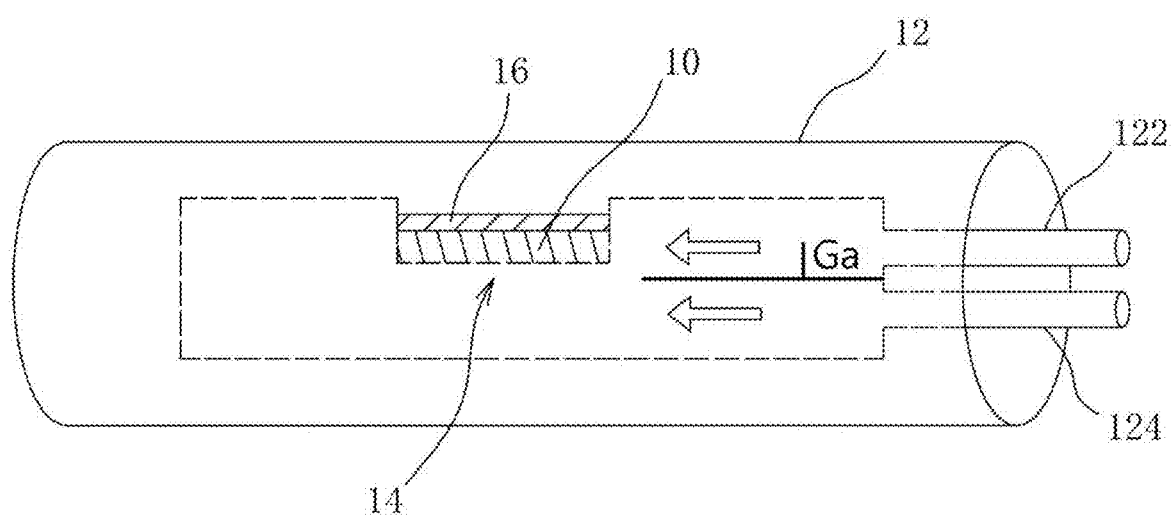
FIG. 2 is a cross-sectional view of a hydride vapor phase epitaxy (HVPE) chamber according to an embodiment of the present invention.

Refer to FIG. 1 and FIG. 2. FIG. 1 is a flowchart of a method for fabricating heteroepitaxial semiconductor material on a mica sheet according to an embodiment of the present invention. FIG. 2 is a cross-sectional view of a hydride vapor phase epitaxy (HVPE) chamber according to an embodiment of the present invention. In Step S10, a mica substrate 10 is provided. In the embodiment, the mica substrate 10 is realized with a fluorophlogopite mica substrate. Fluorophlogopite mica is resistant to more than 1200° C. Thus, at high temperature, the volume resistivity of fluorophlogopite mica is 1000 times of the volume resistivity of natural mica and fluorophlogopite mica features high electric insulativity, an ultralow vacuum gas emission rate, high acid-resistant properties, high transparence, and dividable and flexible properties. Fluorophlogopite mica is an important non-metal insulation material in the present industries and the high technology, such as electrical machinery industries, electrical industries, electric appliances, and aviation industries. Besides, fluorophlogopite mica includes fewer impurities. Fluorophlogopite mica has higher light transmittance within a range from the wavelength (0.2 μm) of ultraviolet light to the wavelength (5 μm) of infrared light. Fluorophlogopite mica sheet has a quasi-hexagonal layered crystal structure. The surface of fluorophlogopite mica sheet is easily peeled off. The peeled surface has the thinnest thickness of 0.02 mm. The peeled surface has the atomic smoothness and the chemical inertness, which are helpful in growing fluorophlogopite mica in a two-dimensional direction. Fluorophlogopite mica features difficultly-deformed and high pressure-resistant properties, high stretch-resistant strength, high compression-resistant strength, and aging-resistant, firm, and difficultly-absorbing properties. As a result, the mica substrate 10 has a thickness of 20 μm. Then, in Step S12, a nitrogen gun is used to blow the remaining solvent on the surface of the mica substrate 10 to dry the mica substrate 10 after using alcohol to clean the surface of the mica substrate 10.

In the embodiment, the semiconductor material is GaN and the fabrication condition of growing heteroepitaxial GaN on the mica substrate is described as follows. In addition to GaN, the semiconductor film is alternatively made of GaAs or GaIn. The fabrication condition depends on the material of the semiconductor film. As a result, any light emitting semiconductor material epitaxially grown on the mica substrate is included within the scope of the present invention. The thickness of the semiconductor film is 1%~50% of the thickness of the mica substrate, such that the best flexible substrate is fabricated. The present invention exemplifies hydride vapor phase epitaxy (HVPE) for explanation. In Step S14, the cleaned mica substrate 10 is placed in the reactive area 14 of a hydride vapor phase epitaxy reaction chamber 12. The pressure of the hydride vapor phase epitaxy reaction chamber 12 is fixed and set to 700 torr and gas is inputted to the hydride vapor phase epitaxy reaction chamber 12. The upper tube 122 of the hydride vapor phase epitaxy reaction chamber 12 inputs HCl to react with the Ga source area of the hydride vapor phase epitaxy reaction chamber 12 to generate $GaCl_3$ used as the source of III-group gas at 850° C. Simultaneously, the lower tube 124 of the hydride vapor phase epitaxy reaction chamber 12 inputs $NH_3$ used as the source of V-group gas. Preferably, the ratio of V-group gas to III-group gas is 13.33. Of course, the ratio of V-group gas to III-group gas is slightly adjusted according to different semiconductor materials to satisfy the best fabrication condition. The upper tube 122 and the lower tube 124 input carrier gas to the reactive area 14 at the same time, wherein the carrier gas comprises hydrogen and nitrogen. At this time, the reactive area 14 performs an epitaxy process at 600~950° C. In Step S16, $GaCl_3$ reacts with $NH_3$ to generate GaN at a temperature of larger than 600° C. and at least one GaN film 16 is deposited on the mica substrate 10. The thickness of the semiconductor film 16 is 1%~50% of the thickness of the mica substrate 10, thereby forming a flexible substrate.

The present invention uses a van der Waals force-based heteroepitaxial mechanism to deposit the GaN film 16 on the mica substrate 10 under the specific fabrication condition, such as pressure, temperature, and total flow of gas. Specifically, the flexibility and the thickness of fluorophlogopite mica are related to each other. The strength of fluorophlogopite mica increases and the flexibility decreases when the thickness increases. The strength and the flexibility of fluorophlogopite mica are moderate when the fluorophlogopite mica substrate has a thickness of 20~40 µm. Thus, the fluorophlogopite mica substrate is suitably used for the flexible substrate when the fluorophlogopite mica substrate has a thickness of 20~40 µm. In the embodiment, the mica substrate 10 has a thickness of 20 µm. The advantage of the two-dimensional material is that the GaN film 16 is combined with the surface of the mica substrate 10 without using dangling bonds. Thus, the present invention epitaxially grows the GaN film 16 on the mica substrate 10 to overcome the problems with lattice mismatch and difference between thermal expansion coefficients of the GaN film 16 and the mica substrate 10.

The GaN film 16 is deposited on the mica substrate 10 by HVPE. The speed (about 100 µm/hr) of growing the GaN film 16 is very high. The speed is very helpful in growing a thick film. HVPE is used to grow crystal with good quality. HVPE is the most suitable crystal-growing method to grow an independent substrate. HVPE has only drawback of the poor surface flatness. The GaN film 16 is easily deposited to have hexagonal grains. However, the subsequent grinding and polishing processes are performed on the GaN film 16 to achieve the better surface flatness. As mentioned above, the present invention uses a van der Waals force-based epitaxy method to grow the GaN film 16 on the mica substrate 10 under a specific fabrication condition. The present invention not only reduces the stress between the film and the substrate, but also achieves the best quality of heterogeneous epitaxy. The present invention fabricates a flexible substrate that features large area, acid and alkaline resisting properties, high transparency, ultrahigh thermal stability, and long-preserved properties.

Figure 3:
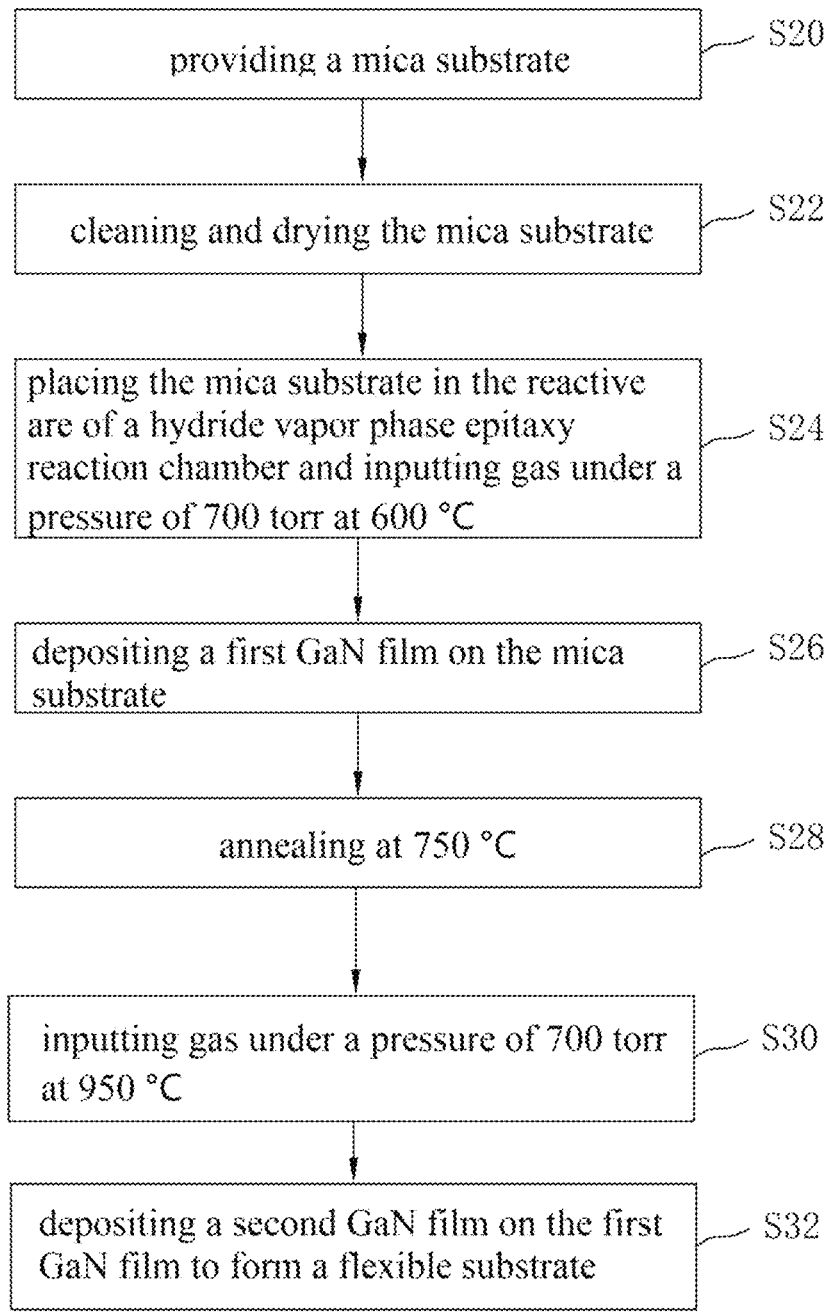
FIG. 3 is a flowchart of a method for fabricating heteroepitaxial semiconductor material on a mica sheet according to another embodiment of the present invention.
Figure 4:
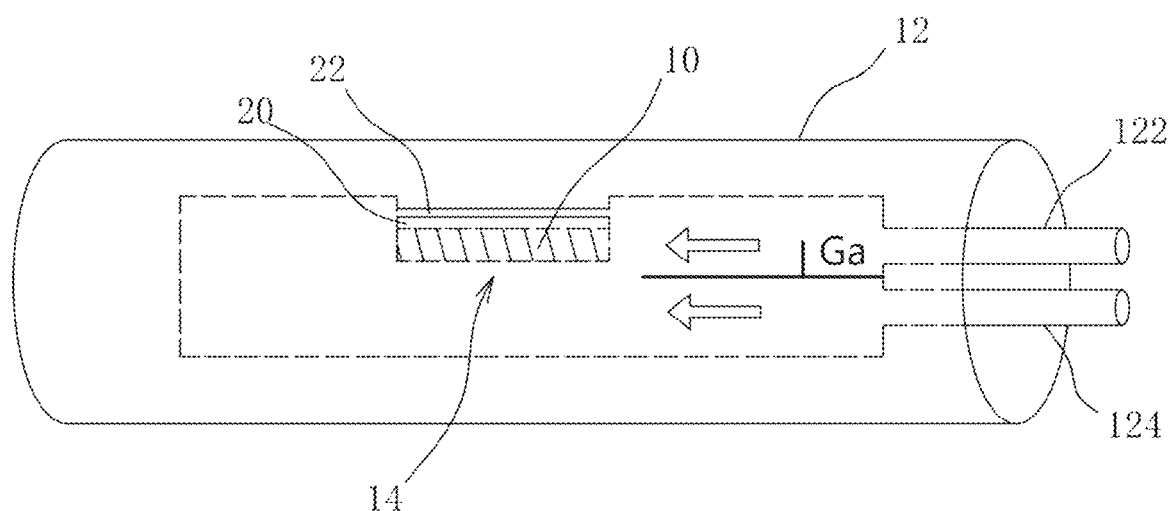
FIG. 4 is a cross-sectional view of a hydride vapor phase epitaxy (HVPE) chamber according to another embodiment of the present invention.

In addition to epitaxially growing one GaN film 16 on the mica substrate 10, the method of the present invention varies according to the requirement of the industrial application and fabrication process. Refer to FIG. 3 and FIG. 4. FIG. 3 is a flowchart of a method for fabricating heteroepitaxial semiconductor material on a mica sheet according to another embodiment of the present invention. FIG. 4 is a cross-sectional view of a hydride vapor phase epitaxy (HVPE) chamber according to another embodiment of the present invention. The present invention exemplifies hydride vapor phase epitaxy (HVPE) for explanation. In Step S20, a mica substrate 10 is provided. The mica substrate 10 is exemplified by a fluorophlogopite mica substrate. The mica substrate 10 has a thickness of 20 µm. In Step S22, a nitrogen gun is used to blow the remaining solvent on the surface of the mica substrate 10 to dry the mica substrate 10 after using alcohol to clean the surface of the mica substrate 10. A GaN film is a hard structure. During a cooling process, the GaN film easily warps due to different thermal expansion coefficients of the GaN film and the mica substrate 10. In order to achieve the purpose of stability and flexibility, the deposited GaN film has a thickness of less than 1 µm. The epitaxy parameters depend on the flow of gas growing GaN nanowires. The flexible substrate with the best quality is fabricated by varying the thickness of the GaN film and the flow ratio of gas. In an epitaxy process, different fabrication conditions, such as temperature, the flow ratio of $NH_3$ to HCl, and the total flow of carrier gas, influence the shape of the GaN film. In Step S24, the dried mica substrate 10 is placed in the reactive area 14 of a hydride vapor phase epitaxy reaction chamber 12. The pressure of the hydride vapor phase epitaxy reaction chamber 12 is fixed and set to 700 torr and gas is inputted to the hydride vapor phase epitaxy reaction chamber 12. The upper tube 122 of the hydride vapor phase epitaxy reaction chamber 12 inputs hydrogen chloride. Simultaneously, the lower tube 124 of the hydride vapor phase epitaxy reaction chamber 12 inputs ammonia. It is noted that the upper tube 122 and the lower tube 124 input carrier gas to reactive area 14, wherein the carrier gas comprises hydrogen and nitrogen. At this time, the reactive area 14 performs an epitaxy process at 600° C. for 0.5 hour. In Step S26, a first GaN film 20 is deposited on the mica substrate 10. The first GaN film 20 has good quality and good uniformity at 600° C., but the light intensity of the first GaN film 20 is not optimized. In order to stabilize quality, the process proceeds to Step S28. In Step S28, the first GaN film 20 is annealed at 750° C. for 10 minutes to reduce the crystal defects of the first GaN film 20, such that the first GaN film 20 is flatter. When the annealing temperature is higher than the temperature of the first GaN film 20, the internal defects of crystals move to normal positions of lattices and internal stress disappears. During a recrystallization process, new crystal grains are formed to replace crystal grains that deform due to the internal stress. Then, the new crystal grains start to grow. During a growth process, small crystal grains are combined with large crystal grains to reduce the number of internal grain boundaries. In this step, the surface of the first GaN film 20 becomes flatter. When the annealing temperature is higher than the temperature of the first GaN film 20, the sizes of crystal grains are enlarged to apparently improve their integrity. The annealing time should not be too long, lest the first gallium nitride film 20 be deteriorated. Preferably, the annealing time is 10 minutes.

In Step S30, the pressure of the hydride vapor phase epitaxy reaction chamber 12 is fixed and set to 700 torr and gas is inputted. The upper tube 122 of the hydride vapor phase epitaxy reaction chamber 12 inputs hydrogen chloride. Simultaneously, the lower tube 124 of the hydride vapor phase epitaxy reaction chamber 12 inputs ammonia. It is noted that the upper tube 122 and the lower tube 124 input carrier gas to reactive area 14, wherein the carrier gas comprises hydrogen and nitrogen. At this time, the reactive area 14 performs an epitaxy process at 950° C. In Step S32, a second GaN film 22 is deposited on the first GaN film 20 to form a flexible substrate. That is to say, the present invention uses a simple process to fabricate a flexible substrate with economic benefits.

The present invention proves that the heteroepitaxial flexible substrate, which features optimization, flexibility, high transparency, and ultrahigh thermal stability, is successfully fabricated using GaN epitaxy. As shown in FIGS. 5(a)-5(d), an optical microscope (OM) is used to determine the uniformity and transparency of the second GaN film 22. From X-ray rocking curves (XRCs), the full width at half maximum (FWHM) of the waveforms of the present invention represents the qualities of the deposited GaN films under different conditions. The FWHM of the waveform in FIG. 5(c) is narrowest. Thus, the quality of the second GaN film 22 is optimized. Refer to FIGS. 6(a)-6(d). FIGS. 6(a)-6(d) are diagrams showing the two-dimensional and three-dimensional images of a flexible substrate observed by an atomic force microscope according to an embodiment of the present invention. The variations of the size of crystal grains and the roughness of GaN films at each step of the method of the present invention are described as follows. As shown in FIG. 6(a), the surface of the mica substrate 10 is very flat. As shown in FIG. 6(b), the first GaN film 20 is deposited at 600° C. The image shows smaller crystal grains during the primary nucleation induction period. The smaller crystal grains cluster but not gather. As shown in FIG. 6(c), the second GaN film 22 is deposited at 900° C. for 15 minutes (having a thickness of 300 nm). The crystal grains start to be enlarged and gather to form islands. The surface roughness of the second GaN film 22 is 15.1 nm. As shown in FIG. 6(d), the second GaN film 22 is deposited at 950° C. for 30 minutes (having a thickness of 500 nm). At this time, the surface roughness of the second GaN film 22 is 20.2 nm, the crystal grains are distributed the entire surface of the second GaN film 22, the grain boundaries are connected and combined with each other, and the surface roughness becomes more stable. Accordingly, it is inferred that the deposition mode of the second GaN film 22 should be three-dimensional growth.

Figure 7A:
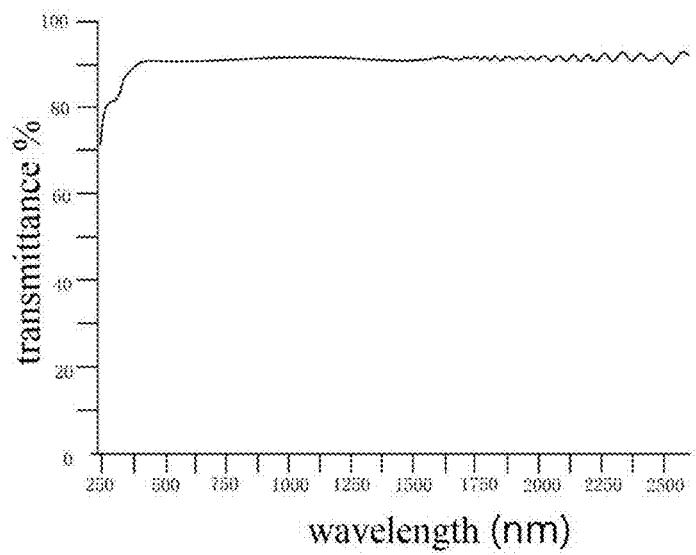
FIGS. 7(a)-7(d) are diagrams showing the light transmittance of the flexible substrate according to an embodiment of the present invention.
Figure 7B:
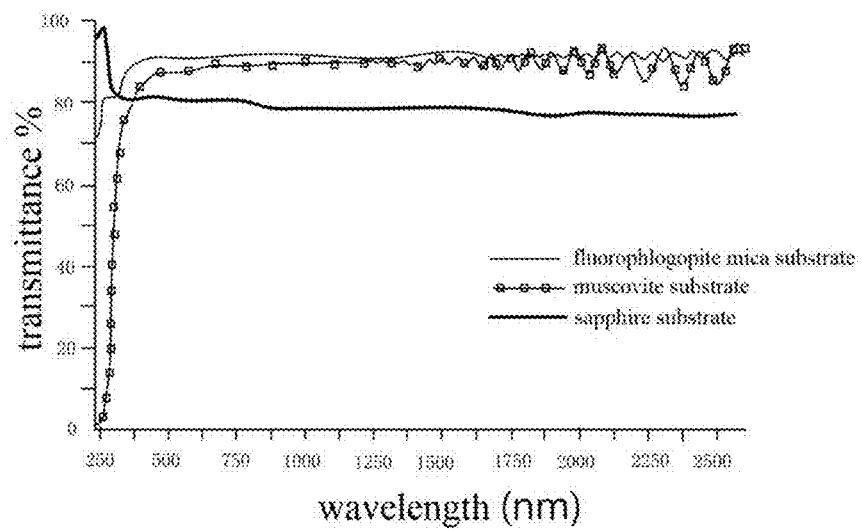
Figure 7C:
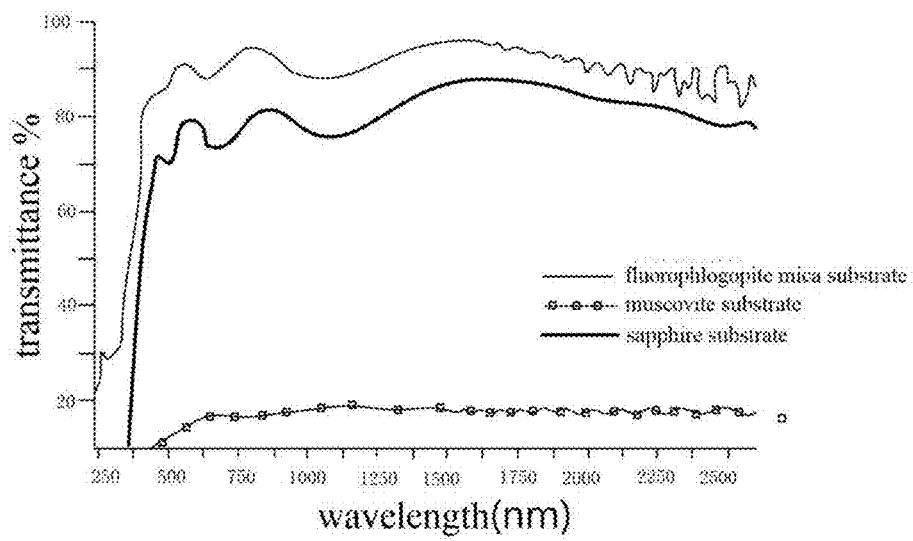
Figure 7D:
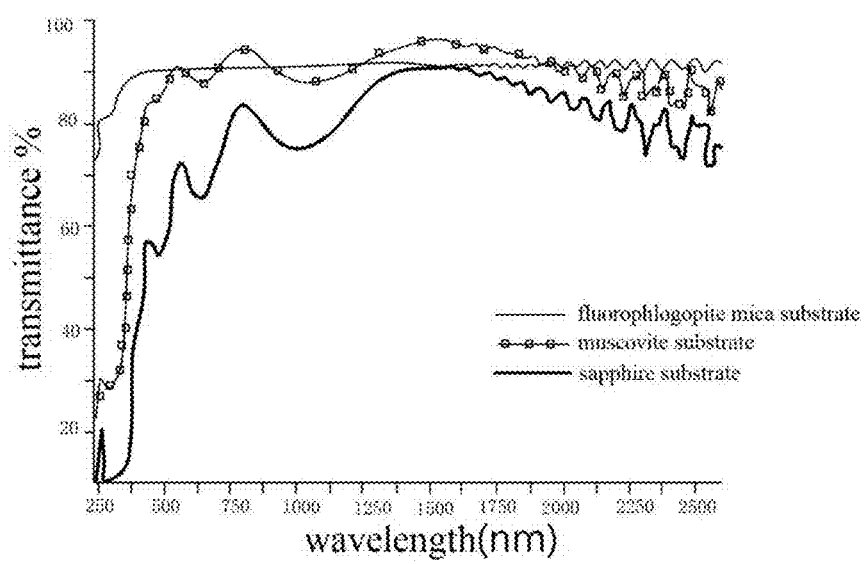

Refer to FIGS. 7(a)-7(d). FIGS. 7(a)-7(d) are diagrams showing the light transmittance of the flexible substrate according to an embodiment of the present invention. As shown in FIG. 7(a), the light transmittance of the mica substrate 10 is measured. The mica substrate 10 has a thickness of 20 μm. Taking a fluorophlogopite mica substrate as an example. The fluorophlogopite mica substrate has average light transmittance of 90.94%. FIG. 7(b) shows the light transmittance of a sapphire substrate, a muscovite substrate, and a fluorophlogopite mica substrate. As shown in FIG. 7(b), the light transmittance of the fluorophlogopite mica substrate is better than the light transmittance of the muscovite substrate and the sapphire substrate. In other words, the fluorophlogopite mica substrate has better light transmittance. Although the muscovite substrate has good light transmittance, the light transmittance of the muscovite substrate is lightly worse than that of the fluorophlogopite mica substrate. In FIG. 7(c), a GaN film is deposited on each of the sapphire substrate, the muscovite substrate, and the fluorophlogopite mica substrate. After comparison, the fluorophlogopite mica substrate and the GaN film deposited thereon have better light transmittance. FIG. 7(d) shows the light transmittance of a GaN film having a thickness of 500 nm, a GaN film having a thickness of 100 nm, and the fluorophlogopite mica substrate. The light transmittance of the GaN film having a thickness of 100 nm in some wavelength ranges is better than the light transmittance of the fluorophlogopite mica substrate. The light transmittance of the GaN films having thicknesses of 100 nm and 500 nm rapidly increases at a wavelength of less than 500 nm when the wavelength increases. The GaN films having thicknesses of 100 nm and 500 nm maintain the light transmittance of 80% rather than decrease at a wavelength of higher than 500 nm. The light transmittance of the GaN film having thicknesses of 100 nm reaches as high as 91.4% at a wavelength of visible light being 555 nm perceived by human eyes.

Figure 8A:
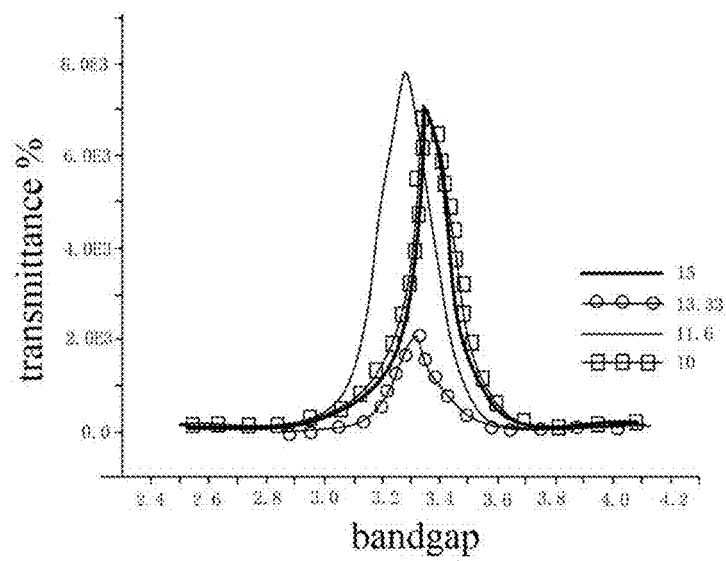
FIGS. 8(a)-8(b) are diagrams showing the excitation spectrums of fluorescent light according to an embodiment of the present invention.
Figure 8B:
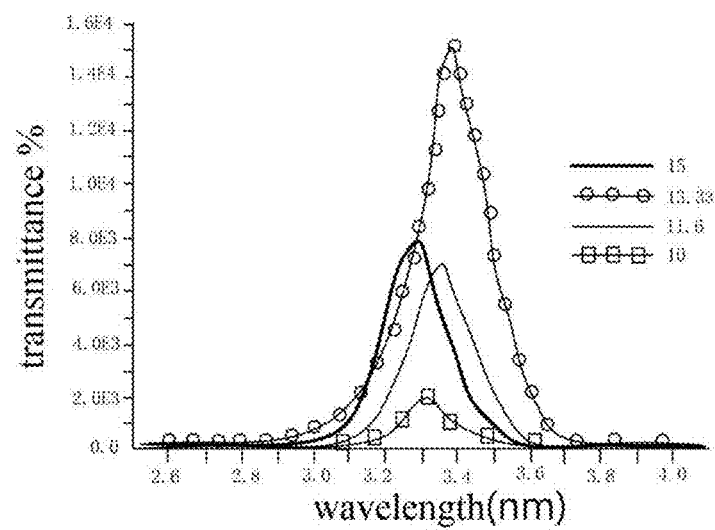

Refer to FIGS. 8(a)-8(b). FIGS. 8(a)-8(b) are diagrams showing the excitation spectrums of fluorescent light. The present invention performs an epitaxy process under a specific fabrication condition. For example, the reactive area performs an epitaxy process under a pressure of 700 torr at 600~950° C. The fabrication condition also includes the ratio of V-group gas to III-group gas and the total flow of carrier gas. For example, the flow ratio of $NH_3$ to HCl is 13.33 (as denoted in figure). FIG. 8(a) shows the light intensity before an annealing process. FIG. 8(b) shows the light intensity after an annealing process. As shown in figures, the light intensity after an annealing process is apparently larger than the light intensity before an annealing process. The main peak of the light intensity is closer to the bandgap of GaN. The bandgap of GaN is 3.4 eV located within the energy range of ultraviolet light. When the main peak shown in the spectrum of fluorescent light is closer to the bandgap of GaN, the impurities included in the GaN film is less, the epitaxy quality of GaN is better, and the light intensity is higher. Therefore, the method of the present invention successfully improves the light intensity under the specific fabrication process.

Figure 9:
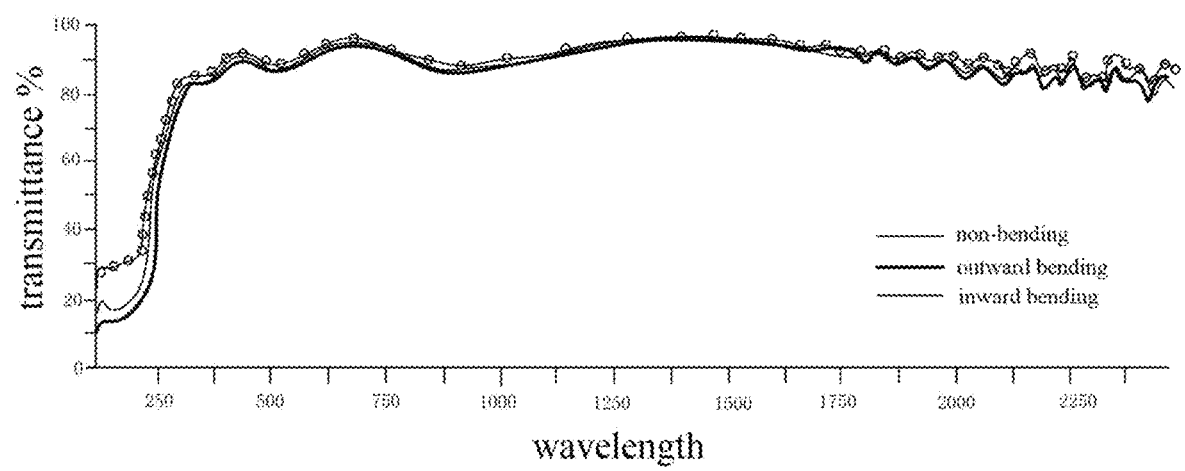
FIG. 9 is a diagram showing the light transmittance of the flexible substrate under a compressive stress and a tensile stress according to an embodiment of the present invention.

The present invention breakthroughs the bottleneck of technology and fabricates a flexible substrate with high flexibility. Refer to FIG. 9. FIG. 9 is a diagram showing the light transmittance of the flexible substrate under a compressive stress and a tensile stress according to an embodiment of the present invention. In the present invention, the flexible radius of curvature of the flexible substrate having a thickness of 100 nm is under test using a flexible substrate testing system (not shown). According to the test results, the flexible substrate has high flexible durability and high percentages of transmittance under a compressive stress or a tensile stress. The optical properties and quality of the flexible substrate do not be changed due to a fact that the flexible substrate has been flexed.

In conclusion, the present invention uses the van der Waals force-based epitaxy method to grow the GaN film on the mica substrate under the specific fabrication condition, reduces the stress between the film and the substrate, achieves the high transmittance and high uniformity of the heteroepitaxy substrate, and fabricates a flexible substrate with excellent flexibility, retention, bending resistance, high strength, high stability, and light weight. The flexible substrate has a golden prospect. The flexible substrate is applied to various applications, such as wearable devices, portable photoelectric equipment, or improving the speed and bandwidth of commercial and military systems, such that the flexible substrate has the competitiveness in the market. In addition to HVPE, the GaN film is also deposited on the mica substrate by pulsed laser deposition (PLD) or molecular beam epitaxy (MBE) to form a flexible substrate. If the semiconductor film is a GaAs film or a GaIn film, the semiconductor film is deposited on the mica substrate by PLD or MBE to form a flexible substrate.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A method for fabricating heteroepitaxial semiconductor material on a mica sheet comprising:

providing a mica substrate; and depositing at least one semiconductor film on the mica substrate by hydride vapor phase epitaxy to form a flexible substrate, wherein when the at least one semiconductor film is a GaN film and the mica substrate is a fluorophlogopite mica substrate, the GaN film is deposited on the fluorophlogopite mica substrate through a van der Waals force-based heteroepitaxial mechanism and the GaN film is combined with a surface of the fluorophlogopite mica substrate without using dangling bonds, and wherein a thickness of the fluorophlogopite mica substrate is between 20 μm and 40 μm.

2. The method for fabricating heteroepitaxial semiconductor material on the mica sheet according to claim 1, wherein the at least one semiconductor film is a GaAs film, or a GaIn film.

3. The method for fabricating heteroepitaxial semiconductor material on the mica sheet according to claim 2, wherein the at least one semiconductor film is the GaN film, and the GaN film is deposited on the mica substrate under a pressure of 700 torr at a temperature between 600° C. and 950° C. in a chamber.

4. The method for fabricating heteroepitaxial semiconductor material on the mica sheet according to claim 3, wherein during the depositing of the GaN film on the mica substrate under the pressure of 700 torr at the temperature between 600° C. and 950° C. in the chamber, gas is inputted into the chamber, and the gas includes ammonia, hydrogen chloride and carrier gas.

5. The method for fabricating heteroepitaxial semiconductor material on the mica sheet according to claim 4, wherein the carrier gas includes hydrogen and nitrogen.

6. The method for fabricating heteroepitaxial semiconductor material on the mica sheet according to claim 1, wherein the at least one semiconductor film includes first and second semiconductor films.

7. The method for fabricating heteroepitaxial semiconductor material on the mica sheet according to claim 6, wherein the first and second semiconductor films are GaN films, and the first and second semiconductor films are respectively deposited on the mica substrate in separate stages each at a temperature between 600° C. and 950° C., the temperature during deposit of the second semiconductor film being higher than the temperature during deposit of the first semiconductor film.

8. The method for fabricating heteroepitaxial semiconductor material on the mica sheet according to claim 7, wherein the depositing of the two semiconductor films on the mica substrate includes annealing the two semiconductor films at a temperature of 750° C. for 10 minutes.

9. The method for fabricating heteroepitaxial semiconductor material on the mica sheet according to claim 1, wherein a thickness of the at least one semiconductor film is between 1% and 50% of a thickness of the mica substrate.

10. A method for fabricating heteroepitaxial semiconductor material on a mica sheet comprising:
providing a mica substrate;
depositing a first semiconductor film on the mica substrate at a first temperature between 600° C. and 950° C.; and
depositing a second semiconductor film on the first semiconductor film at a second temperature between 600° C. and 950° C. to thereby form a flexible substrate, the second temperature being higher than the first temperature, wherein when the first and second semiconductor films are GaN films and the mica substrate is a fluorophlogopite mica substrate, the GaN films are deposited on the fluorophlogopite mica substrate through a van der Waals force-based heteroepitaxial mechanism and the GaN films are combined with a surface of the fluorophlogopite mica substrate without using dangling bonds, and wherein a thickness of the fluorophlogopite mica substrate is between 20 μm and 40 μm.

11. The method for fabricating heteroepitaxial semiconductor material on the mica sheet according to claim 10, wherein the first and second semiconductor films are deposited on the mica substrate within a chamber, the method further comprising inputting gases into the chamber, the gases including ammonia, hydrogen chloride, and a carrier gas.

12. The method for fabricating heteroepitaxial semiconductor material on the mica sheet according to claim 11, wherein the carrier gas includes hydrogen and nitrogen.

13. The method for fabricating heteroepitaxial semiconductor material on the mica sheet according to claim 10, wherein the first and second semiconductor films are deposited on the mica substrate under a pressure of 700 torr.

14. The method for fabricating heteroepitaxial semiconductor material on the mica sheet according to claim 10, further comprising annealing the first semiconductor film at an annealing temperature higher than the first temperature and lower than the second temperature.

15. The method for fabricating heteroepitaxial semiconductor material on the mica sheet according to claim 14, wherein the first temperature is substantially 600° C., the second temperature is substantially 950° C., and the annealing temperature is substantially 750° C.

16. The method for fabricating heteroepitaxial semiconductor material on the mica sheet according to claim 10, wherein the first and second semiconductor films are deposited on the mica substrate by a chemical vapor deposition process.

17. The method for fabricating heteroepitaxial semiconductor material on the mica sheet according to claim 16, wherein the chemical vapor deposition process includes hydride vapor phase epitaxy.

* * * * *